(12) United States Patent
Shen et al.

(10) Patent No.: US 9,203,525 B2
(45) Date of Patent: Dec. 1, 2015

(54) ENCODING METHOD AND DEVICE

(71) Applicant: Huawei Technologies Co., Ltd., Shenzhen, Guangdong (CN)

(72) Inventors: Hui Shen, Shenzhen (CN); Bin Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/577,810

(22) Filed: Dec. 19, 2014

(65) Prior Publication Data
US 2015/0103947 A1 Apr. 16, 2015

Related U.S. Application Data

(63) Continuation of application No. PCT/CN2013/075818, filed on May 17, 2013.

(30) Foreign Application Priority Data

Jun. 29, 2012 (CN) .......................... 2012 1 0222709

(51) Int. Cl.
| H04L 27/00 | (2006.01) |
| H04B 14/00 | (2006.01) |
| H03M 13/13 | (2006.01) |
| H04L 1/00 | (2006.01) |
| H03M 13/29 | (2006.01) |
| H04B 1/04 | (2006.01) |

(52) U.S. Cl.
CPC ............. *H04B 14/008* (2013.01); *H03M 13/13* (2013.01); *H03M 13/2906* (2013.01); *H04B 1/04* (2013.01); *H04L 1/0041* (2013.01)

(58) Field of Classification Search
None
See application file for complete search history.

(56) References Cited

U.S. PATENT DOCUMENTS

| 8,347,186 B1 * | 1/2013 | Arikan ........................... 714/774 |
| 2013/0111291 A1 * | 5/2013 | Ma ................................. 714/752 |

FOREIGN PATENT DOCUMENTS

| CN | 101902296 A | 12/2010 |
| CN | 102122966 A | 7/2011 |

OTHER PUBLICATIONS

Mathis Seidl, et al., "Improving Successive Cancellation Decoding of Polar Codes by Usage of Inner Block Codes", 2010 6th International Symposium on Turbo Codes & Iterative Information Processing, Sep. 6, 2010, p. 103-106.

A. Eslami, et al., "A Practical Approach to Polar Codes", 2011 IEEE International Symposium on Information Theory Proceedings, Jul. 31-Aug. 5, 2011, p. 16-20.

(Continued)

*Primary Examiner* — Chieh M Fan
*Assistant Examiner* — Wednel Cadeau

(57) ABSTRACT

The present invention provides an encoding method and an encoding device. The method includes: dividing to-be-encoded input data into M parts according to the number of levels of concatenated Polar encoding, where M is the number of levels of concatenated Polar encoding; and performing Polar encoding for information bits of each level of Polar encoding level by level to obtain Polar-encoded data of the input data, where each part of data obtained through the dividing and output bits of a previous level of Polar encoding serve together as information bits of a next level of Polar encoding. Embodiments of the present invention can improve performance of Polar codes.

10 Claims, 7 Drawing Sheets

(56) References Cited

OTHER PUBLICATIONS

Peter Trifonov, et al., "Generalized Concatenated Codes Based on Polar Codes", 2011 8th International Symposium on Wireless Communication Systems, Nov. 6, 2011, p. 442-446.

Erdal Arikan, "Channel polarization: A method for constructing capacity-achieving codes for symmetric binary-input memoryless channels", Jul. 20, 2009, 23 pages.

Ido Tal, et al., "List Decoding of Polar Codes", 2011 IEEE International Symposium on Information Theory Proceedings, 2011, 5 pages.

Viveck R. Cadambe, et al., "Interference Alignment and Spatial Degrees of Freedom for the K User Interference Channel", Jul. 11, 2007, 30 pages.

\* cited by examiner

ENCODING METHOD AND DEVICE

CROSS-REFERENCE TO RELATED APPLICATIONS

This application is a continuation of International Application No. PCT/CN2013/075818, filed on May 17, 2013, which claims priority to Chinese Patent Application No. 201210222709.7, filed on Jun. 29, 2012, both of which are hereby incorporated by reference in their entireties.

TECHNICAL FIELD

The present invention relates to encoding and decoding technologies, and in particular to an encoding method and an encoding device.

BACKGROUND

A communications system generally uses channel encoding to improve reliability of data transmission and ensure communications quality. A polar code is an encoding scheme that is theoretically proved to be capable of achieving Shannon capacity with low encoding and decoding complexity. When a length of a Polar code is very large, high performance can be achieved through Successive-Cancellation (SC) decoding. However, when the Polar code is short or has a medium length, its performance is not optimal and needs to be improved.

SUMMARY

Embodiments of the present invention provide an encoding method and an encoding device to improve performance of Polar codes.

An embodiment of the present invention provides an encoding method, including:
dividing to-be-encoded input data into M parts according to the number of levels of concatenated Polar encoding, where M is the number of levels of concatenated Polar encoding; and
performing Polar encoding level by level to obtain Polar-encoded data of the input data, where each part of data obtained through the dividing and output bits of a previous level of Polar encoding serve together as information bits of a next level of Polar encoding.

An embodiment of the present invention provides an encoding device, including:
a dividing module, configured to divide to-be-encoded input data into M parts according to the number of levels of concatenated Polar encoding, where M is the number of levels of concatenated Polar encoding; and
an encoding module, configured to perform Polar encoding for information bits of each level of Polar encoding level by level to obtain Polar-encoded data of the input data, where each part of data obtained through the dividing and output bits of a previous level of Polar encoding serve together as information bits of a next level of Polar encoding.

As can be seen from the foregoing technical solutions, in the Polar encoding according to the embodiments of the present invention, output bits of a previous level of Polar encoding and a part of data serve together as information bits of a next level of Polar encoding to implement partially-concatenated Polar encoding. Because a concatenation mode is applied, polarization of Polar codes can be accelerated. In addition, in a partial concatenation mode, a higher code rate can be achieved under a condition of a same code length, thereby improving performance of the Polar codes.

BRIEF DESCRIPTION OF DRAWINGS

To illustrate the technical solutions in the embodiments of the present invention more clearly, the following briefly introduces the accompanying drawings required for describing the embodiments. Apparently, the accompanying drawings in the following description show some embodiments of the present invention, and a person of ordinary skill in the art may still derive other drawings from these accompanying drawings without creative efforts.

DESCRIPTION OF EMBODIMENTS

To make the objectives, technical solutions, and advantages of the embodiments of the present invention more comprehensible, the following clearly and completely describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Polar encoding is described below first.

A Polar code is a linear block code. Its generation matrix is $G_N$, and its encoding process is $x_1^N = u_1^N G_N$, where $x_1^N$ indicates output bits after encoding, $u_1^N$ indicates input bits before the encoding, $G_N = B_N F^{\otimes n}$, a length of the code is $N=2^n$, and $n \geq 0$.

$B_N$ indicates a transposed matrix, such as a bit reversal matrix.

$F^{\otimes n}$ indicates a Kronecker power of F, defined as $F^{\otimes n} = F \otimes F^{\otimes(n-1)}$, where:

$$F = \begin{bmatrix} 1 & 0 \\ 1 & 1 \end{bmatrix}.$$

A polar code may be expressed in a form of a coset code as $(N,K,A,u_{A^c})$, and its encoding process is: $x_1^N = u_A G_N(A) \oplus u_{A^c} G_N(A^c)$, where A indicates a set of information bit indexes, $G_N(A)$ indicates a sub-matrix derived from rows that exist in $G_N$ and correspond to indexes in the set A, and $G_N(A^c)$ indicates a sub-matrix derived from rows that exist in $G_N$ and correspond to indexes in the set $A^c$. $u_{A^c}$ indicates frozen bits, which are known bits, and the number of frozen bits is (N–K). For simplicity, such frozen bits may be set to 0s. N indicates a code length, and K indicates a length of information bits.

Figure 1:
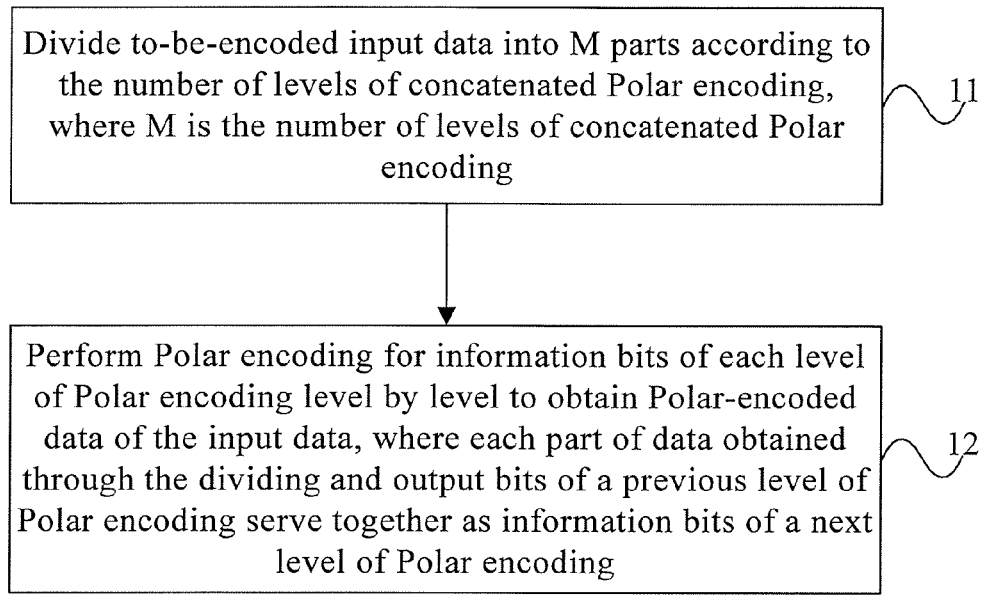
FIG. 1 is a schematic flowchart of an encoding method according to an embodiment of the present invention.

FIG. 1 is a schematic flowchart of an encoding method according to an embodiment of the present invention. The method includes the following steps:

Step 11: Divide to-be-encoded input data into M parts according to the number of levels of concatenated Polar encoding, where M is the number of levels of concatenated Polar encoding.

Step 12: Perform Polar encoding for information bits of each level of Polar encoding level by level to obtain Polar-encoded data of the input data, where each part of data obtained through the dividing and output bits of a previous level of Polar encoding serve together as information bits of a next level of Polar encoding.

In this embodiment of the present invention, to improve performance of a Polar code of a finite length, Polar encoding is performed in a partial concatenation manner, and output of the previous level of Polar encoding is used as a part of input of the next level of Polar encoding.

Assuming that the number of concatenation levels in this embodiment of the present invention is M, where M is settable, the input data is divided into M parts, and each part of data and the output of the previous level of Polar encoding serve together as information bits of the next level of Polar encoding.

Specifically, M=2 is taken as an example. In this case, two levels of Polar encoding are included. According to a signal route, the two levels of Polar encoding are respectively called first Polar encoding and second Polar encoding. Output of the first Polar encoding is used as input of the second Polar encoding. For the first Polar encoding, input information bits of the first Polar encoding are a first part of data obtained through dividing; for the second Polar encoding, its input information bits include: a second part of data obtained through dividing and output bits after the first Polar encoding.

Because bits after the previous level of Polar encoding are a part of input information bits of the next level of Polar encoding, this concatenation mode may be understood as partial concatenation.

Figure 2:
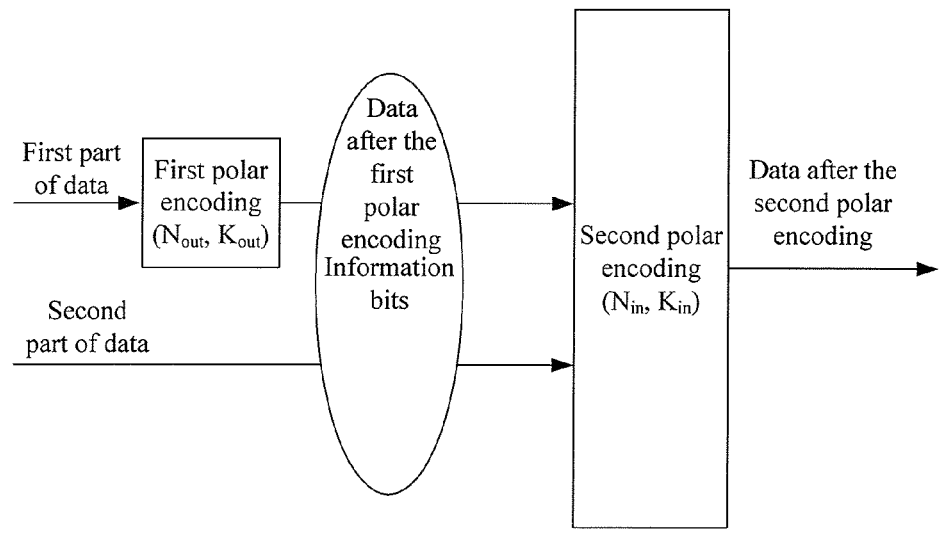
FIG. 2 is an overall schematic diagram of two-level partially-concatenated Polar encoding according to the present invention.

Referring to FIG. 2, which is a schematic diagram of two levels of concatenation given according to the present invention. The two levels of Polar encoding may be respectively called first Polar encoding and second Polar encoding. A code length and an information bit length corresponding to the first Polar encoding are $N_{out}$ and $K_{out}$ respectively, and a code length and an information bit length corresponding to the second Polar encoding are $N_{in}$ and $K_{in}$ respectively. A unit of a length is bit.

First, the input data is divided into a first part of data and a second part of data. A length of the first part of data and a length of the second part of data may be determined according to parameters corresponding to the first Polar encoding and the second Polar encoding. For example, the length of the first part of data is $K_{out}$, and the length of the second part of data is $K_{in}-N_{out}$. After then, data of a corresponding length may be selected, according to the length of the first part of data or the length of the second part, as the first part of data or the second part of data. The selection may be made randomly or according to a selection algorithm set by a user. After the first part of data and the second part of data are obtained, the first Polar encoding is performed for the first part of data to obtain data after the first Polar encoding. A length of the data after the first Polar encoding is $N_{out}$. Then the data after the first Polar encoding and the second part of data serve together as information bits for the second Polar encoding to obtain desired Polar-encoded data. A length of the data after the second Polar encoding is $N_{in}$.

Output data after the first Polar encoding may specifically serve as: apart of information bits with relatively low reliability among input information bits of the second Polar encoding.

The relatively low reliability may be determined according to bit capacity, a Bhattacharyya parameter, or an error pattern obtained through Monte Carlo simulation.

Figure 3:
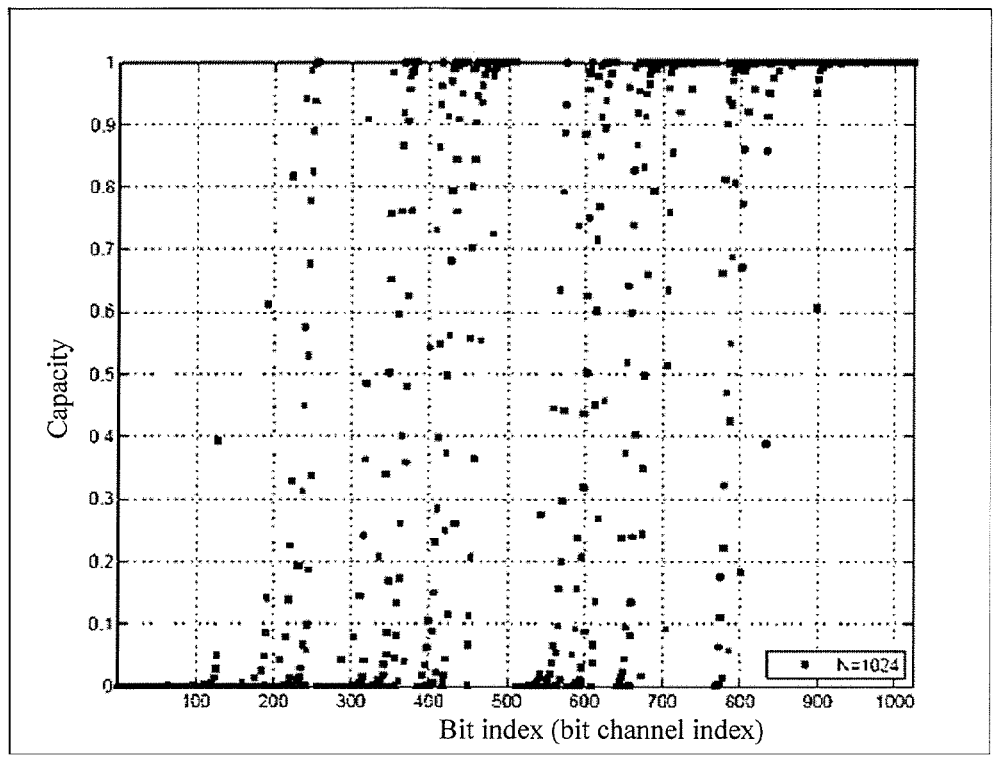
FIG. 3 is a schematic diagram of bit capacity according to the present invention.

Taking the bit capacity as an example, as shown in FIG. 3, bit capacity of each bit is different. Assuming that there are N=1024 bits, K bits with relatively high capacity may be selected as information bits, and the remaining (N–K) bits serve as frozen (frozen) bits. Further, among the K information bits, J bits with relatively low capacity may be selected as the information bits with relatively low capacity. In this case, data output after the first Polar encoding with a length of $N_{out}$ serves as the J bits.

After the foregoing processing, a code rate of the Polar code is $$R = \frac{K_{out} + (K_{in} - N_{out})}{N_{in}}.$$

By contrast, if full concatenation is applied, the code rate is $$\frac{K_{out}}{N_{out}} \times \frac{K_{in}}{N_{in}}.$$

Figure 4:
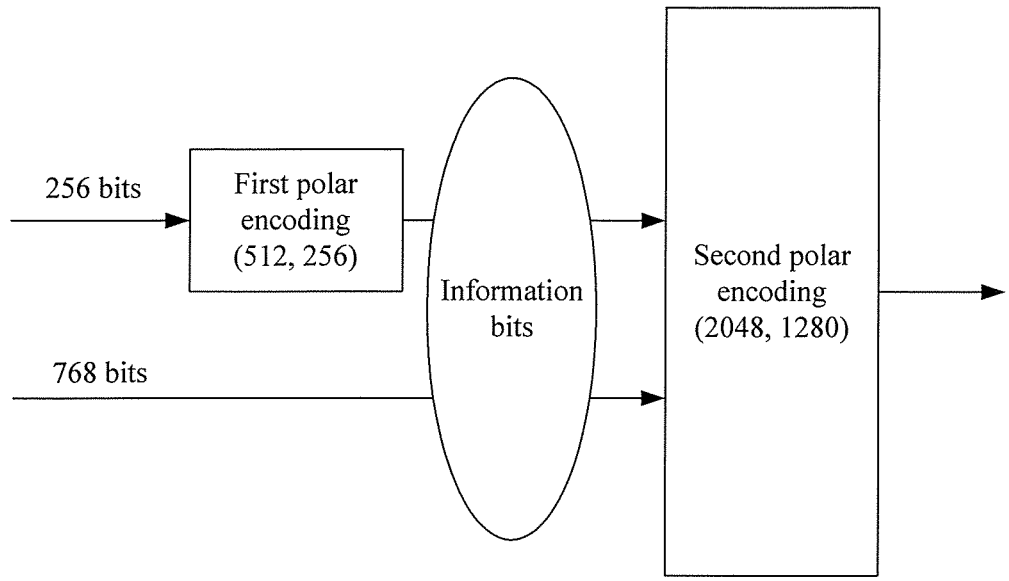
FIG. 4 is a specific schematic diagram of two-level partially-concatenated Polar encoding according to the present invention.
Figure 5:
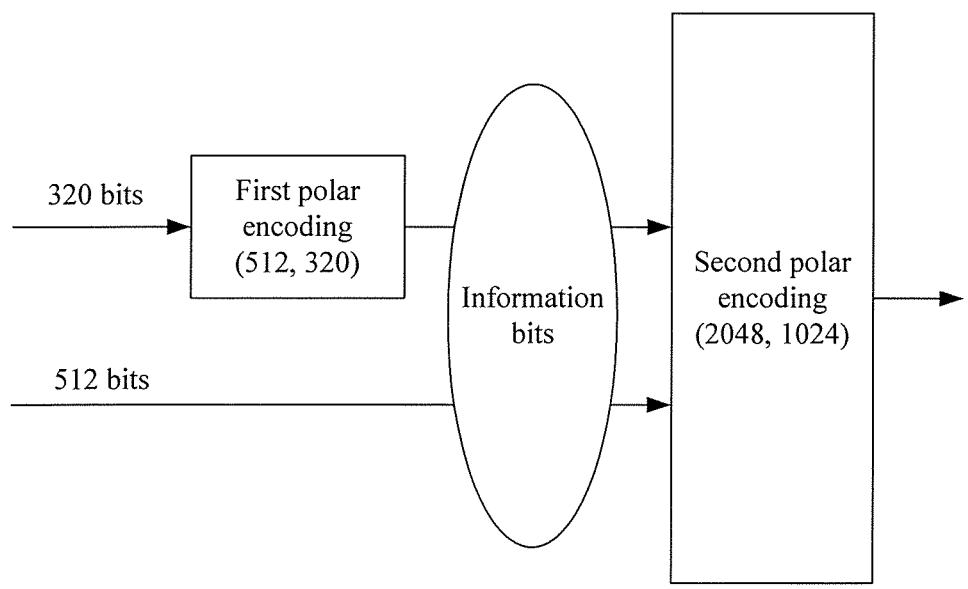
FIG. 5 is another specific schematic diagram of two-level partially-concatenated Polar encoding according to the present invention.

According to the foregoing process, FIG. 4 gives a schematic diagram of encoding when $N_{in}$=2048, $K_{in}$=1280, $N_{out}$=512, and $K_{out}$=256; and FIG. 5 gives a schematic diagram of encoding when $N_{in}$=2048, $K_{in}$=1024, $N_{out}$=512, and $K_{out}$=320.

During decoding, multiple decoding schemes may be applied. First, a decoder corresponding to the second Polar encoding is applied to decode a received signal to obtain a second LLR value and a first LLR value. The second LLR value is an LLR value corresponding to the information bits of the second Polar encoding, and the first LLR value is an LLR value corresponding to the information bits of the first Polar encoding. Then the second LLR value may be judged directly to obtain a result of decoding the information bits of the second Polar encoding. In addition, a decoder corresponding to the first Polar encoding is applied to decode the first LLR value, and a decoding result is judged to obtain a result of decoding the information bits of the first Polar encoding.

Figure 6:
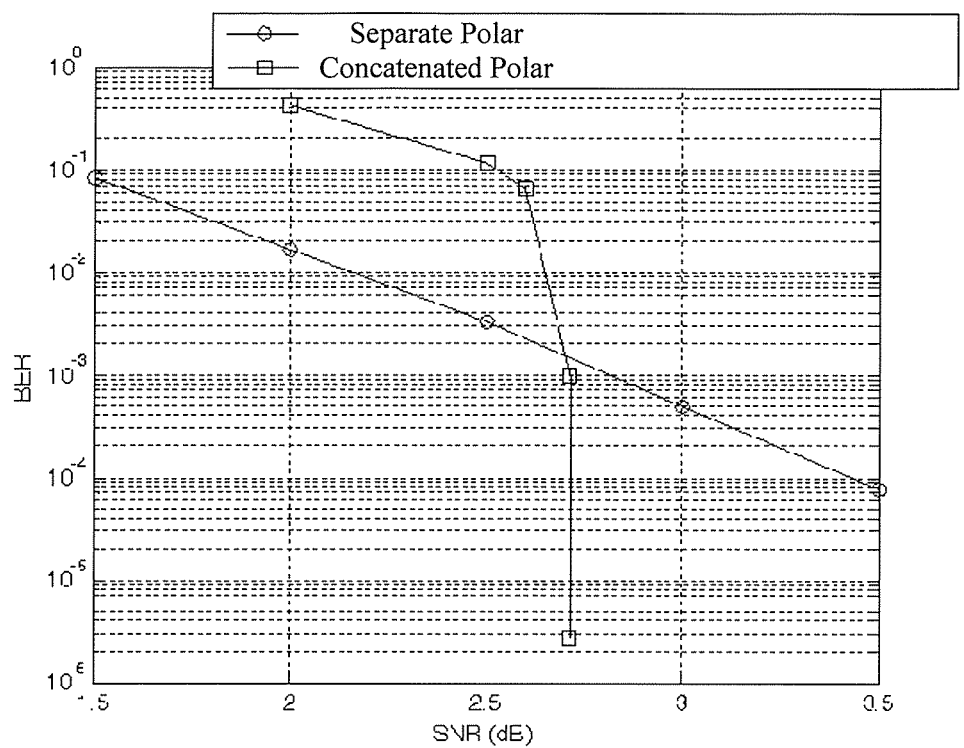
FIG. 6 is a schematic diagram of performance comparison between the present invention and separate Polar codes.
Figure 7:
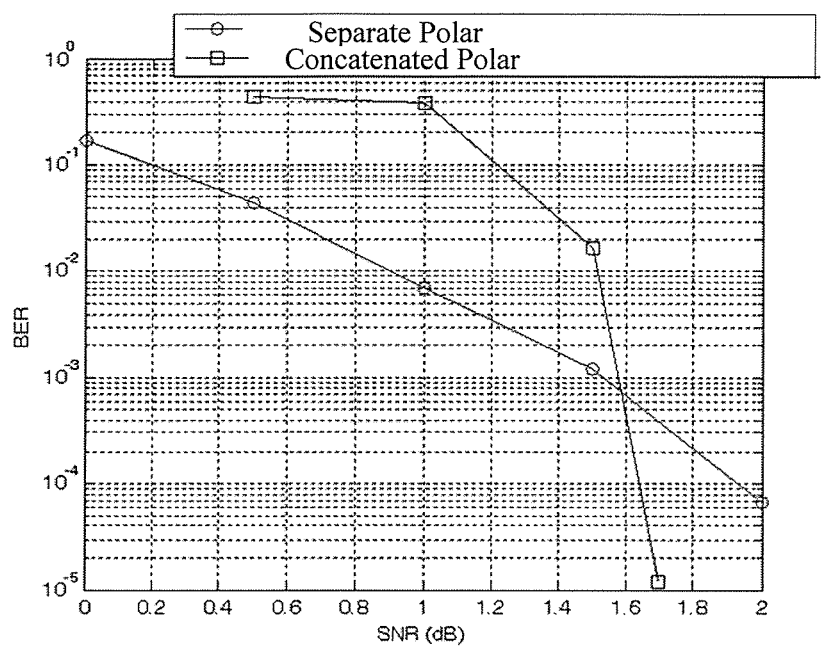
FIG. 7 is another schematic diagram of performance comparison between the present invention and separate Polar codes.

FIG. 6 and FIG. 7 are schematic diagrams of performance comparison between separate Polar codes and concatenated Polar codes according to the present invention. A simulation condition is as follows: A Polar code is decoded through BP (belief propagation) decoding, and the number of iterations is 50. As illustrated in FIG. 6 and FIG. 7, when a BER is $10^{-4}$, a scheme of partially-concatenated Polar codes has a gain of 0.7 dB and 0.3 dB compared with a scheme of separate Polar codes.

In this embodiment of the present invention, concatenated Polar encoding is applied to accelerate polarization of Polar codes and improve performance of a Polar code of a finite length. In addition, because a partial concatenation manner is specifically used for the concatenation, a higher code rate can be obtained under a condition of a same code length.

Figure 8A:
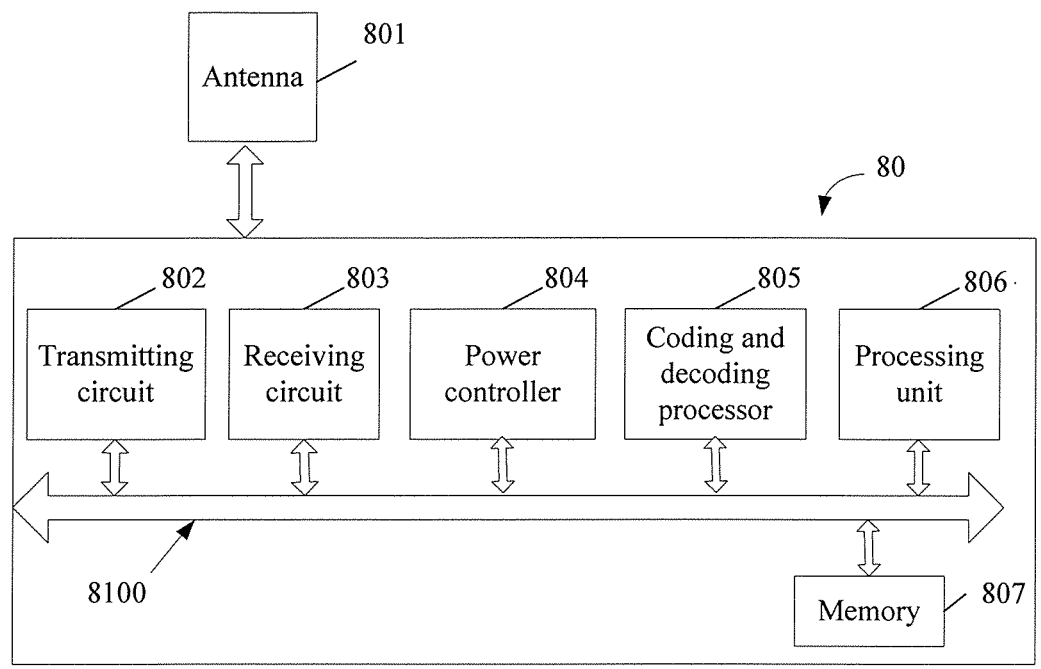
FIG. 8a is a schematic structural diagram of a device that uses the foregoing concatenated Polar encoding according to the present invention.

An embodiment of the present invention further provides an apparatus for implementing the method and its detailed steps described in the foregoing method embodiment. This embodiment of the present invention is applicable to a base station or a terminal in various communications systems. FIG. 8a shows an embodiment of a communications device. In this embodiment, a device 80 includes a transmitting circuit 802, a receiving circuit 803, a power controller 804, a coding and decoding processor 805, a processing unit 806, a memory 807, and an antenna 801. The processing unit 806 controls operations of the device 80, and the processing unit 806 may also be called a CPU. The memory 807 may include a read-only memory and a random access memory, and provides instructions and data to the processing unit 806. A part of the memory 807 may further include a non-volatile random access memory (NVRAM). In a practical application, the device 80 may be embedded into, or may be, a radio communications device such as a mobile phone, and may further include a carrier that accommodates the transmitting circuit 802 and the receiving circuit 803, so as to allow data transmitting and receiving between the device 80 and a remote device. Probably the device 80 is also a simple schematic diagram of a network or a radio device. The transmitting circuit 802 and the receiving circuit 803 may be coupled into the antenna 801. All components of the device 80 are coupled together through a bus system 8100, where the bus system 8100 includes not only a bus, but also a power supply bus, a control bus, and a status signal bus. For clear description, various buses are marked as the bus system 8100 in the figure. The device 80 may further include the processing unit 806 for processing signals, the power controller 804, and the coding and decoding processor 805.

The method disclosed in the preceding embodiment of the present invention may be applied to the coding and decoding processor 805, or in other words, may be implemented by the coding and decoding processor 805. The coding and decoding processor 805 may be an integrated circuit chip capable of processing signals. In an implementation process, each step of the method may be implemented by an integrated logic circuit of hardware of the coding and decoding processor 805 or by instructions in a software form. Such instructions may be implemented through the processor 806 to exercise control and perform the method disclosed in the embodiments of the present invention. The decoding processor may be a universal processor, a digital signal processor (DSP), an application-specific integrated circuit (ASIC), a field programmable gate array (FPGA) or another programmable logical device, a standalone gate or a transistor logic device, or a standalone hardware device; and can implement or execute the method, steps and logical block diagrams disclosed in the embodiments of the present invention. The universal processor may be a microprocessor or any conventional processor, decoder, or the like. The steps of the method disclosed in the embodiments of the present invention may be performed by a hardware decoder directly, or by a combination of hardware and a software module in the decoder. The software module may reside in a random access memory, a flash memory, a read-only memory, a programmable read-only memory, an electrically erasable programmable memory, a register, or another mature storage medium in the art. The storage medium is located in the memory 807, and the decoding unit reads information in the memory 807, and works together with its hardware to perform the steps of the method.

Figure 8B:
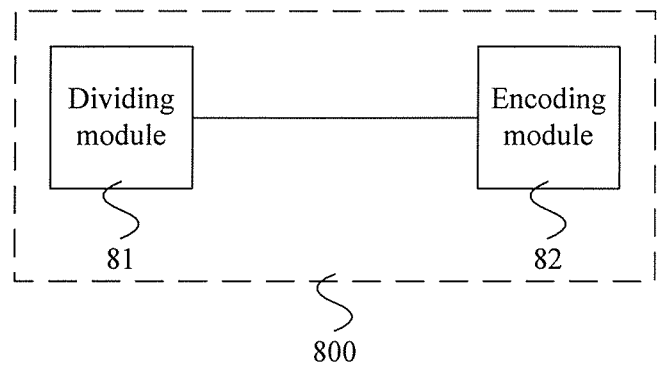
FIG. 8b is a schematic structural diagram of an encoding device according to an embodiment of the present invention.

FIG. 8b is a schematic structural diagram of an encoding device according to an embodiment of the present invention. The encoding device 800 includes a dividing module 81 and an encoding module 82. The dividing module 81 is configured to divide to-be-encoded input data into M parts according to the number of levels of concatenated Polar encoding, where M is the number of levels of concatenated Polar encoding. The encoding module 82 is configured to perform Polar encoding for information bits of each level of Polar encoding level by level to obtain Polar-encoded data of the input data, where each part of data obtained through the dividing and output bits of a previous level of Polar encoding serve together as information bits of a next level of Polar encoding. The dividing module 81 and the encoding module 82 may be the coding and decoding processor 805 in the schematic diagram, or may be logical units of the coding and decoding processor 805. Alternatively, the output bits of the previous level of Polar encoding processed by the encoding module serve as input information bits whose reliability is lower than a threshold in the next level of Polar encoding.

Alternatively, the threshold may be determined according to bit capacity, a bhattacharyya parameter, or an error pattern obtained through Monte Carlo simulation.

Figure 9:
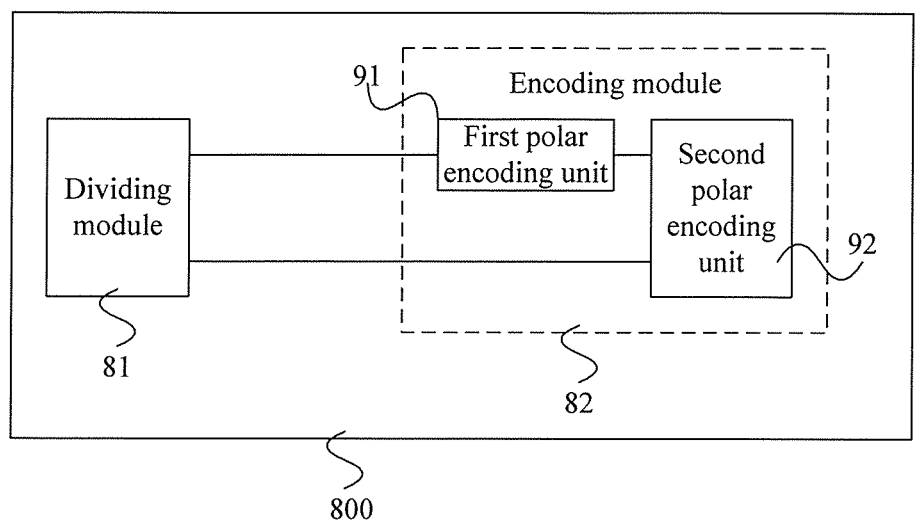
FIG. 9 is a schematic structural diagram of an encoding device according to another embodiment of the present invention.

Refer to FIG. 9. When M is 2:

the dividing module is specifically configured to divide the input data into a first part of data and a second part of data; and the encoding module includes:

a first Polar encoding unit 91, configured to perform first Polar encoding for the first part of data to obtain data after the first Polar encoding; and a second Polar encoding unit 92, configured to perform second Polar encoding for the second part of data and the data after the first Polar encoding to obtain Polar-encoded data of the input data.

Alternatively, a length of the first part of data obtained by the dividing module is a length of information bits corresponding to the first Polar encoding; and a length of the second part of data obtained by the dividing module is a difference between a length of information bits corresponding to the second Polar encoding and a code length corresponding to the first Polar encoding. For example, the code length and the information bit length corresponding to the first Polar encoding unit are $N_{out}$ and $K_{out}$ respectively; a code length and the information bit length corresponding to the second Polar encoding unit are $N_{in}$ and $K_{in}$ respectively; and the length of the first part of data is $K_{out}$, and the length of the second part of data is $K_{in}-N_{out}$.

Alternatively, $N_{in}$ is 2048, $K_{in}$ is 1280, $N_{out}$ is 512, $K_{out}$ is 256, the length of the first part of data is 256, and the length of the second part of data is 768; or, $N_{in}$ is 2048, $K_{in}$ is 1024, $N_{out}$ is 512, $K_{out}$ is 320, the length of the first part of data is 320, and the length of the second part of data is 512.

In the embodiments of the present invention, concatenated Polar encoding is applied to accelerate polarization of Polar codes and improve performance of a Polar code of a finite length. In addition, because a partial concatenation manner is specifically used for the concatenation, a higher code rate can be obtained under a condition of a same code length.

A person of ordinary skill in the art may understand that, all or a part of the steps of the foregoing method embodiments may be implemented by a program instructing relevant hardware. The foregoing program may be stored in a computer readable storage medium. When the program runs, the steps of the foregoing method embodiments are performed. The foregoing storage medium includes various media capable of storing program codes, such as a ROM, a RAM, a magnetic disk, or an optical disk.

Finally, it should be noted that the foregoing embodiments are merely intended for describing the technical solutions of the present invention other than limiting the present invention. Although the present invention is described in detail with reference to the foregoing embodiments, persons of ordinary skill in the art should understand that they may still make modifications to the technical solutions described in the foregoing embodiments, or make equivalent replacements to some or all the technical features thereof, without departing from the scope of the technical solutions of the embodiments of the present invention.

What is claimed is:

1. An encoding method, comprising:
   dividing to-be-encoded input data into M parts according to the number of levels of concatenated Polar encoding, wherein M is the number of levels of concatenated Polar encoding;
   performing Polar encoding for information bits of each level of Polar encoding level by level to obtain Polar-encoded data of the input data, wherein each part of data obtained through the dividing and output bits of a previous level of Polar encoding serve together as information bits of a next level of Polar encoding;
   wherein when M is 2, dividing the input data into a first part of data and a second part of data and performing Polar encoding level by level comprising:
      performing first Polar encoding for the first part of data to obtain data after the first Polar encoding, and
      performing second Polar encoding for the second part of data and the data after the first Polar encoding to obtain Polar-encoded data of the input data; and
   wherein a length of the first part of data is a length of information bits corresponding to the first Polar encoding and a length of the second part of data is a difference between a length of information bits corresponding to the second Polar encoding and a code length corresponding to the first Polar encoding.

2. The method according to claim 1, wherein the output bits of the previous level of Polar encoding serve as input information bits whose reliability is lower than a threshold in the next level of Polar encoding.

3. The method according to claim 1, wherein:
   a code length corresponding to the second Polar encoding is 2048 bits, the length of information bits corresponding to the second Polar encoding is 1280 bits, the code length corresponding to the first Polar encoding is 512 bits, the length of information bits corresponding to the first Polar encoding is 256 bits, the length of the first part of data is 256 bits, and the length of the second part of data is 768 bits; or
   a code length corresponding to the second Polar encoding is 2048 bits, the length of information bits corresponding to the second Polar encoding is 1024 bits, the code length corresponding to the first Polar encoding is 512 bits, the length of information bits corresponding to the first Polar encoding is 320 bits, the length of the first part of data is 320 bits, and the length of the second part of data is 512 bits.

4. The method according to claim 1, wherein dividing to-be-encoded input data into M parts comprises:
   randomly selecting data whose length is the length of information bits corresponding to the first Polar encoding as the first part of data from the to-be-encoded input data, and using data other than the first part of data in the to-be-encoded input data as the second part of data; or
   randomly selecting data whose length is a difference between the length of information bits corresponding to the second Polar encoding and the code length corresponding to the first Polar encoding as the second part of data from the to-be-encoded input data, and using data other than the second part of data in the to-be-encoded input data as the first part of data.

5. The method according to claim 2, wherein the threshold may be determined according to bit capacity, a Bhattacharyya parameter, or an error pattern obtained through Monte Carlo simulation.

6. An encoding device, comprising:
   a dividing module, configured to divide to-be-encoded input data into M parts according to the number of levels of concatenated Polar encoding, wherein M is the number of levels of concatenated Polar encoding; and
   an encoding module, configured to perform Polar encoding for information bits of each level of Polar encoding level by level to obtain Polar-encoded data of the input data, wherein each part of data obtained through the dividing and output bits of a previous level of Polar encoding serve together as information bits of a next level of Polar encoding;
   wherein when M is 2: the dividing module is configured to divide the input data into a first part of data and a second part of data and the encoding module comprises:
      a first Polar encoding unit, configured to perform first Polar encoding for the first part of data to obtain data after the first Polar encoding, and
      a second Polar encoding unit, configured to perform second Polar encoding for the second part of data and the data after the first Polar encoding to obtain Polar-encoded data of the input data; and
   wherein a length of the first part of data obtained by the dividing module is a length of information bits corresponding to the first Polar encoding and a length of the second part of data obtained by the dividing module is a difference between a length of information bits corresponding to the second Polar encoding and a code length corresponding to the first Polar encoding.

7. The device according to claim 6, wherein the output bits of the previous level of Polar encoding that are processed by the encoding module serve as input information bits whose reliability is lower than a threshold in the next level of Polar encoding.

8. The device according to claim 6, wherein:
   a code length corresponding to the second Polar encoding is 2048 bits, the length of information bits corresponding to the second Polar encoding is 1280 bits, the code length corresponding to the first Polar encoding is 512 bits, the length of information bits corresponding to the first Polar encoding is 256 bits, the length of the first part of data is 256 bits, and the length of the second part of data is 768 bits; or
   a code length corresponding to the second Polar encoding is 2048 bits, the length of information bits corresponding to the second Polar encoding is 1024 bits, the code length corresponding to the first Polar encoding is 512 bits, the length of information bits corresponding to the first Polar encoding is 320 bits, the length of the first part of data is 320 bits, and the length of the second part of data is 512 bits.

9. The device according to claim 6, wherein the dividing module is configured to:
   randomly select data whose length is the length of information bits corresponding to the first Polar encoding as the first part of data from the to-be-encoded input data, and use data other than the first part of data in the to-be-encoded input data as the second part of data; or
   randomly select data whose length is a difference between the length of information bits corresponding to the second Polar encoding and the code length corresponding to the first Polar encoding as the second part of data from the to-be-encoded input data, and use data other than the second part of data in the to-be-encoded input data as the first part of data.

10. The device according to claim 7, wherein the threshold may be determined according to bit capacity, a Bhattacharyya parameter, or an error pattern obtained through Monte Carlo simulation.

* * * * *